(12) United States Patent
Feurle et al.

(10) Patent No.: US 6,628,553 B2
(45) Date of Patent: Sep. 30, 2003

(54) DATA OUTPUT INTERFACE, IN PARTICULAR FOR SEMICONDUCTOR MEMORIES

(75) Inventors: Robert Feurle, Neubiberg (DE); Paul Schmölz, München (DE); Jean-Marc Dortu, München (DE); Andreas Täuber, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/157,726

(22) Filed: May 29, 2002

(65) Prior Publication Data

US 2002/0181290 A1 Dec. 5, 2002

(30) Foreign Application Priority Data

May 29, 2001 (DE) .......................... 101 26 115

(51) Int. Cl.$^7$ ................................. G11C 7/00
(52) U.S. Cl. .............. 365/189.05; 365/233; 365/189.12
(58) Field of Search ...................... 365/189.05, 189.12, 365/233

(56) References Cited

U.S. PATENT DOCUMENTS 5,467,311 A * 11/1995 Wiedmann et al. ......... 365/233
6,373,752 B1 * 4/2002 Wright et al. .......... 365/189.05

* cited by examiner

*Primary Examiner*—Huan Hoang
(74) *Attorney, Agent, or Firm*—Laurence A. Greenberg; Werner H. Stemer; Gregory L. Mayback

(57) ABSTRACT

A data output interface, in particular for semiconductor memories, provides a plurality of output drivers for providing data output signals in a manner dependent on a read command and a clock signal. In order to signal to a microprocessor that can be connected to the data output that data are provided, a data provision signal is additionally provided by a further output driver. The arrangement described can preferably be used for DDR-SDRAMs and enables particularly high clock frequencies.

7 Claims, 2 Drawing Sheets

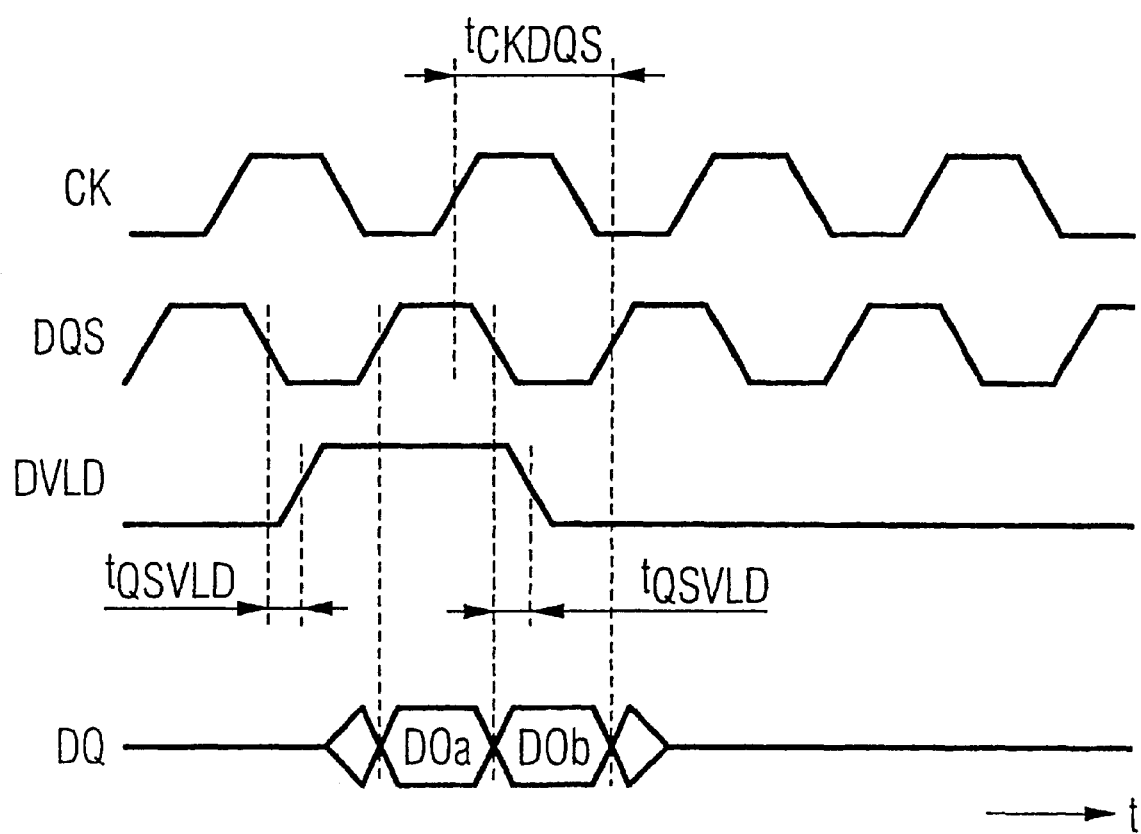

DATA OUTPUT INTERFACE, IN PARTICULAR FOR SEMICONDUCTOR MEMORIES

BACKGROUND OF THE INVENTION

Field of the Invention

The present invention relates to a data output interface, and in particular to a data output interface for semiconductor memories.

Integrated semiconductor circuits usually have an input terminal for feeding in a clock signal. This clock signal can be fed in either as an asymmetrical signal carried on one line or as a symmetrical clock signal carried on two lines. Such a clock signal serves, for example, for synchronizing the component with other components, for supplying internal phase-locked loops, for deriving derived clock signals, etc.

Particularly in high-speed semiconductor memory circuits, for example in double data rate synchronous dynamic random access memories (DDR-SDRAMs), a clock delay, that is to say a phase shift of the clock signal, occurs during the internally distribution of the clock signal on the chip. Moreover, fluctuations in the phase angles of the rising and falling edges of the clock signal can result from the fact that, at high clock frequencies, it is necessary to switch the clock signal for its further processing.

A high-precision clock signal with no or with a very small phase shift of the output clock signal relative to the input clock signal is required, for example, at data output drivers in semiconductor memories for reading-out stored data.

One possibility for correctly synchronizing the phase of an output clock signal with the phase of an input clock signal consists of, for example, artificially adding a further phase shift to the unavoidable phase shift that occurs on the chip, with the aim that the phase shift of the output clock signal relative to the input clock signal amounts to an integer multiple of the clock period of the periodic signal and is accordingly imperceptible. However, this requires an additional measurement and also additional circuitry, and moreover, manufacturing variations can nevertheless lead to lasting phase shifts. Furthermore, a so-called clock skew can remain as a result of switching the clock signal. In other words, the clock edges of the clock signal at the output of the semiconductor memory or integrated circuit fluctuate by a specific phase deviation.

However, a precise signal that is correct with respect to phase is required for a microprocessor to detect the data to be output from a semiconductor memory. The signal is referred to as DQS signal, a data strobe signal, for example, in the case of the DDR SDRAMs described.

SUMMARY OF THE INVENTION

It is accordingly an object of the invention to provide a data output interface which overcomes the above-mentioned disadvantages of the prior art apparatus of this general type.

In particular, it is an object of the invention to provide a data output interface, in particular for high-speed semiconductor memories, in which a low-tolerance signal with regard to its phase angles is provided for the communication of data to be output during a read operation from the semiconductor module.

With the foregoing and other objects in view there is provided, in accordance with the invention, a data output interface, including: an interface data output (the data output of the data output interface); an interface data input (the data input of the data output interface) for feeding in data that will be output at the interface data output; an interface clock input for feeding in a clock signal; an interface activation input for initiating data outputting of the data that will be output at the interface data output; and at least one output driver having a data input and a data output coupling the interface data input to the interface data output. The output driver has a clock input coupled to the interface clock input. The output driver has an activation input coupled to the interface activation input. The data output interface also includes a further output driver having a data input coupled to said interface activation input. The further output driver has a clock input coupled to the interface clock input. The further output driver has a data output providing a signal for indicating that the data are being provided at the interface data output and can be read-out.

In accordance with the principle of the present invention, the data output interface is supplemented by an additional signal, for indicating that data are available at the output of the data output interface. This data can be read out via a data bus, for example.

This signal is derived in a manner dependent on the clock signal fed to the data output interface with an unavoidable clock delay and also from an activation signal which indicates, for example, a read command from the semiconductor memory to the outside.

This signal for indicating that data are provided at the output of the data output interface is independent of an output clock signal whose phase angle, as explained in the introduction, can fluctuate first with regard to the clock input signal and secondly with regard to temporal drift effects.

Since an output driver module, for example a D-type flip-flop, which is normally present anyway in a data output interface of a semiconductor memory can be used for generating the indication signal, the principle specified can be implemented in particular in high-speed semiconductor memories such as DDR-SDRAMs with little outlay on circuitry.

Instead of a bi-directional data strobe signal, DQS, that is usually provided for the synchronization of a read operation in the case of such semiconductor memories, the present data output interface enables operation at higher frequencies.

Moreover, the provision of a symmetrical output clock signal, a so-called echo clock signal, whose phase angle need not be corrected, means that the entire phase jitter of an integrated circuit can be significantly reduced.

In this case, the described signal for indicating that data for read-out are provided at the output itself leads the data at the data output interface.

In accordance with an added feature of the invention, a plurality of output drivers are provided for coupling the data input and the data output of the data output interface. The output drivers couple two respective data inputs to a respective data output using a parallel/serial conversion.

By way of example, in DDR memory modules, data can be read into the input of the output driver with each clock period, and data to be read from the memory can be output at the output with each clock edge, that is to say with the double data rate.

In this case, output drivers are understood to be active components, for example D-type flip-flops, which provide a sufficient drive power to transfer data from a semiconductor chip to another integrated circuit module, for example, a microprocessor, via a data bus.

In accordance with an additional feature of the invention, the further output driver has two data inputs that are connected to one another. Deriving the signal for indicating that data for read-out are being provided at the data output, using the input clock signal and also by using an activation signal of the data output interface, it is advantageously possible likewise to use an output driver module, for example, a D-type flip-flop, having two data inputs. These data inputs are connected to one another.

In accordance with another feature of the invention, the output driver and the further output driver are in each case designed as a D-type flip-flop each having two data inputs.

In this case, the further output driver can preferably have its activation input put permanently at the state of a logic 1. The input clock signal of the data output interface can preferably be fed to the D-type flip-flop using edge triggering with a falling clock edge.

By virtue of the fact that a simple D-type flip-flop, as is usually found anyway in large numbers in data output interfaces of fast semiconductor memories, can be used for providing the signal for indicating that data for read-out are provided at the data output, the circuit described can be derived from customary semiconductor memory circuits with particularly little outlay on circuitry.

In accordance with a further feature of the invention, a shift register is provided for setting a read delay. The shift register has an input connected to the activation input of the data output interface. The shift register has an output connected to the output driver. The shift register has a clock input connected to the clock input of the data output interface.

In this case, the shift register controls a desired, adjustable read delay from the data output interface to the outside. Instead of the shift register, it is also possible, of course, to use another device for setting the read delay with the input, output and control terminals described.

In accordance with a further added feature of the invention, two still further output drivers provide a symmetrical output clock signal. The clock inputs of the further output drivers are coupled to the clock input of the data output interface.

The special feature of the bi-directional data strobe signal is that the clock inputs of the still further output drivers, which can likewise be embodied as D-type flip-flops, are directly connected to the clock input of the data output interface, but unlike the rest of the output drivers and the further output driver, are not driven via the shift register with a clock delay.

In this case, this symmetrical output clock signal is not used for switching and may have an unknown phase deviation, which may additionally be subject to temperature drifts, relative to the input clock signal. Nevertheless, the arrangement described ensures a reliable and phase-correct indication that data are provided at the data output. Since, in the case of the present arrangement, the clock signal can accordingly run freely in the data output interface and does not have to be switched, there is an overall reduction of the phase jitter on the entire chip on which the present data output interface is integrated. The present data output interface can be integrated on the chip together with a semiconductor memory, for example. Just like the data output of the data output interface, usually referred to as DQ, it is also possible to embody the described symmetrical DQS signal on a bi-directional bus as interface with a semiconductor memory.

Other features which are considered as characteristic for the invention are set forth in the appended claims.

Although the invention is illustrated and described herein as embodied in a data output interface it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 shows signal profiles of selected clock and data signals of the data output interface shown in FIG. 1.

DESCRIPTION OF THE PREFERRED EMBODIMENTS

Figure 1:
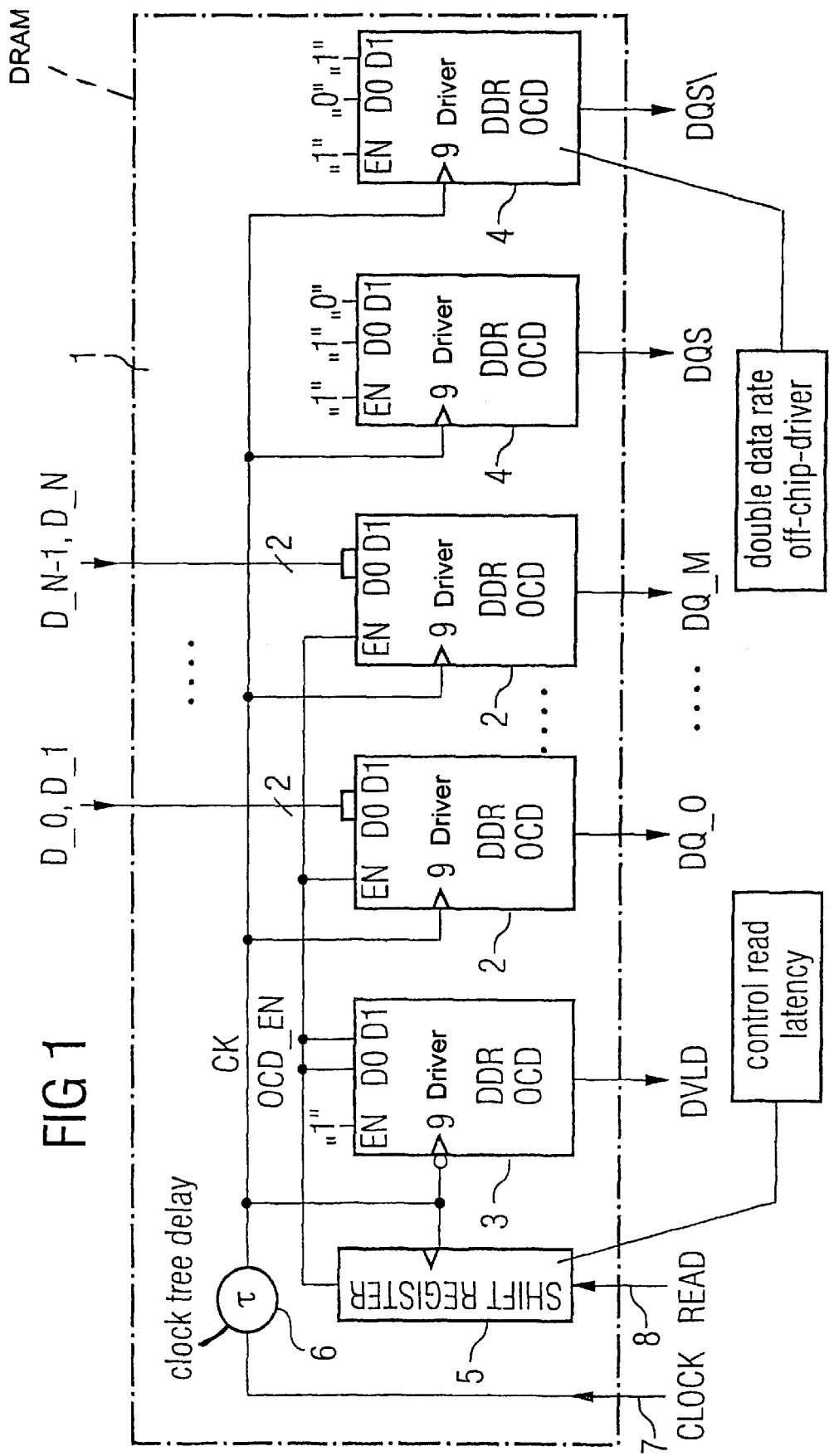
FIG. 1 shows a simplified block diagram of an exemplary embodiment of a data output interface of a semiconductor memory.

Referring now to the figures of the drawing in detail and first, particularly, to FIG. 1 thereof, there is shown a double data rate synchronous dynamic random access memory (DDR SDRAM), with a data output interface 1 for outputting data that are to be read from the semiconductor chip. For this provision is made of a plurality of data output drivers 2, in total N2, which, at their data inputs, couple a plurality of parallel data lines D_0, D_1 etc. to D_N, in total N, to data lines DQ_0 to DQ_M that can be led off at their output. Since the present arrangement is a DDR memory module, on the output side of the semiconductor memory there are in total only half as many data outputs for connection to I/O pins of the semiconductor component as there are data lines D_0 to D_N provided on the input side, where M=N 2.

Furthermore, the data output interface 1 includes a further output driver 3 for providing a data provision signal indicating that a new data word is being provided at the data outputs DQ_O to DQ_M. Still further data output drivers 4 are likewise provided in the data output interface 1. The further data output drivers 4 are for providing an output clock signal DQS, DQS\which is provided as a symmetrical output clock signal.

The output drivers 2, 3, 4 are in each case provided, as D-type flip-flops having two data inputs D0, D1, an activation input EN, and an edge-triggered clock input 9. The output drivers 2, 3, 4 are designed as so-called DDR memory chip output drivers, or DDR OCD, off-chip drivers. For clock driving, the output drivers 2 are directly connected to the clock input terminal 7. In this case, however, a parasitic, undesired clock delay occurs, which is depicted in the present block diagram with the delay module 6 as a concentrated equivalent element. The clock signal CK, which has a delay relative to the signal that is applied to the input clock terminal 7, is fed unchanged to the clock inputs 9 of the output drivers 2 and in inverted form to the clock input 9 of the further output driver 3. The clock terminals 9 of the still further output drivers 4 are connected in non-inverting fashion to the clock input terminal 7 for feeding in the delayed clock signal CK.

The activation inputs EN of the output drivers 2 are connected to the output of the shift register 5 such that a delayed activation signal OCD_EN can be fed in to the output drivers 2. A read command READ can be fed to the input of the shift register 5. The shift register 5 also has a clock input terminal connected to the clock input terminal 7. The shift register 5 can set or control a time delay of the execution of the read command.

Furthermore, the output of the shift register 5 is connected to the two data inputs D0, D1 of the output driver 3 designed as a D-type flip-flop. The activation input EN of the further output driver 3 is put permanently at logic 1. Accordingly, the phase angle of the data provision signal DVLD which can be derived on the output side of the further output driver 3 depends on the parasitic delay 6 of the clock line and also on a read delay that can be set using the shift register 5. The delayed clock signal CK is fed to the further output driver 3 in inverted form, however, with respect to the output drivers 2.

The still further output drivers 4 for providing the symmetrical strobe signal DQS, DQS\likewise have an activation input EN, which is put permanently at a logic 1, while the data inputs D0 and D1 are in each case put at logic 1, 0 and 0, 1, respectively. Moreover, since the D-type flip-flops 4 are driven by the same, namely the rising, clock edge, a symmetrical output clock signal DQS, DQS\is produced on the output side.

Accordingly, in the case of the present arrangement, this symmetrical strobe signal DQS is not used for switching, but rather the data provision signal DVLD indicates that data are provided at the data outputs DQ_0 to DQ_M if a read command READ is present. As can be seen from the block diagram, the data provision signal DVLD is advantageously independent of the clock signal DQS. The described combination of the symmetrical output clock signal DQS, DQS= with the data provision signal DVLD makes it possible, in particular in DDR-SDRAMs, to achieve particularly high frequencies. Moreover, compared with a conventional DQS system corresponding to the specification of 256-megabit DDR-SDRAMs, the total phase jitter of the integrated circuit is significantly reduced.

FIG. 2 shows the signal profiles of selected signals in the data output interface 1 shown in the block diagram of FIG. 1. Namely, FIG. 2 shows the delayed clock input signal CK, the output clock signal DQS, the data provision signal DVLD, and also an exemplary data output signal DQ. Relative to the clock signal CK, the symmetrical output signal DQS has a delay time $t_{CKDQs}$ which results principally from the circuitry and internal delays of the still further output driver 4.

The delay of the data provision signal DVLD relative to the DQS signal DQS results from the read delay set in the shift register 5. In this case, it must be taken into consideration that the further output driver 3 is oppositely edge-triggered with respect to the output driver 2 and the still further output drivers 4. This delay is designated by $t_{QSVLD}$. The data signal DQ itself, which is depicted as a symmetrical signal, is exactly phase-correct with the DQS signal. It is possible to discern the transfer—typical of DDR semiconductor memories—of two data words per clock cycle at the I/O pins in the present signal profile.

The data provision signal DVLD is at a logic high level during a clock period and the falling edge of the data provision signal DVLD again has the delay $t_{QSVLD}$ relative to the DQS signal.

We claim:

1. A data output interface, comprising:
    an interface data output;
    an interface data input for feeding in data that will be output at said interface data output;
    an interface clock input for feeding in a clock signal;
    an interface activation input for initiating data outputting of the data that will be output at said interface data output;
    at least one output driver having a data input and a data output coupling said interface data input to said interface data output, said output driver having a clock input coupled to said interface clock input, said output driver having an activation input coupled to said interface activation input; and
    a further output driver having a data input coupled to said interface activation input, said further output driver having a clock input coupled to said interface clock input, said further output driver having a data output providing a signal for indicating that the data are being provided at said interface data output and can be read-out.

2. The data output interface according to claim 1, wherein:
    said interface data input includes a plurality of interface data inputs;
    said interface data output includes a plurality of interface data outputs;
    said at least one output driver defines a plurality of output drivers for coupling said plurality of said interface inputs to said plurality of said interface outputs; and
    each one of said plurality of said output drivers couples two respective ones of said plurality of said interface data inputs to a respective one of said plurality of said interface data outputs using a parallel to serial conversion.

3. The data output interface according to claim 2, wherein said data input of said further output driver includes two data inputs that are directly connected to one another.

4. The data output interface according to claim 1, wherein:
    said at least one output driver and said further output driver are each designed as a D-type flip-flop;
    said data input of said at least one output driver includes two data inputs; and
    said data input of said further output driver includes two data inputs.

5. The data output interface according to claim 1, comprising:
    a shift register for setting a read delay;
    said shift register having an input connected to said interface activation input, said shift register having an output connected to said at least one output driver, and said shift register having a clock input connected to said interface clock input.

6. The data output interface according to claim 1, comprising:
    two further output drivers for providing a symmetrical output clock signal;
    said two further output drivers having clock inputs coupled to said interface clock input.

7. A data output interface for a semiconductor memory, comprising:
    an interface data output;
    an interface data input for feeding in data that will be output at said interface data output;
    an interface clock input for feeding in a clock signal;
    an interface activation input for initiating data outputting of the data that will be output at said interface data output;
    at least one output driver having a data input and a data output coupling said interface data input to said interface data output, said output driver having a clock input coupled to said interface clock input, said output driver having an activation input coupled to said interface activation input; and a further output driver having a data input coupled to said interface activation input, said further output driver having a clock input coupled to said interface clock input, said further output driver having a data output providing a signal for indicating that the data are being provided at said interface data output and can be read-out.

* * * * *